US011876002B2

(12) United States Patent
Bronchy et al.

(10) Patent No.: US 11,876,002 B2
(45) Date of Patent: Jan. 16, 2024

(54) METHOD FOR INTERCONNECTING COMPONENTS OF AN ELECTRONIC SYSTEM BY SINTERING

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE DE BORDEAUX, Bordeaux (FR); INSTITUT POLYTECHNIQUE DE BORDEAUX, Talence (FR)

(72) Inventors: Maxime Bronchy, Grenoble (FR); Etienne Duguet, Begles (FR); Céline Feautrier, Grenoble (FR); Mona Treguer-Delapierre, Villenave d'Ornon (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE DE BORDEAUX, Bordeaux (FR); INSTITUT POLYTECHNIQUE DE BORDEAUX, Paris (FR)

(*) Notice: Subject to any disclaimer, the term of this patent is extended or adjusted under 35 U.S.C. 154(b) by 0 days.

(21) Appl. No.: 17/446,767

(22) Filed: Sep. 2, 2021

(65) Prior Publication Data
US 2022/0068664 A1    Mar. 3, 2022

(30) Foreign Application Priority Data
Sep. 3, 2020   (FR) .................................. 20 08955

(51) Int. Cl.
H01L 21/48 (2006.01)
H01L 21/477 (2006.01)
B22F 3/24 (2006.01)

(52) U.S. Cl.
CPC ............ *H01L 21/4814* (2013.01); *B22F 3/24* (2013.01); *H01L 21/477* (2013.01); *B22F 2998/10* (2013.01)

(58) Field of Classification Search
None
See application file for complete search history.

(56) References Cited

U.S. PATENT DOCUMENTS

2015/0282330 A1    10/2015  Iseda et al.
2017/0077057 A1*    3/2017  Endoh ................. B23K 1/0016
(Continued)

FOREIGN PATENT DOCUMENTS

CN    103606394 A    2/2014
CN    108847395 A    11/2018
(Continued)

OTHER PUBLICATIONS

French Preliminary Search Report dated Mar. 3, 2021 in French Application 2008955 filed on Sep. 3, 2020, 3 pages (with English Translation of Categories of Cited Documents).
(Continued)

*Primary Examiner* — Anthony M Liang
(74) *Attorney, Agent, or Firm* — Oblon, McClelland, Maier & Neustadt, L.L.P.

(57) ABSTRACT

A method for interconnecting components of an electronic system includes depositing a sintering solution onto a first component to form an interconnection layer, the sintering solution comprising a solvent, metal nanoparticles dispersed in the solvent, and a stabilizing agent adsorbed onto the nanoparticles. More than 95.0%, preferably more than
(Continued)

99.0% of the mass of the nanoparticles include a metal selected from silver, gold, copper and alloys thereof and have a polyhedral shape with an aspect ratio greater than 0.8. The method also includes eliminating, at least partially, the solvent from the layer to form an ordered agglomerate in which the nanoparticles are regularly disposed in three axes, the stabilizing agent binding them together and maintaining at least a portion of the nanoparticles at a distance from each other, debinding and sintering the layer, and depositing a second component in contact with the layer before or during debinding or sintering.

18 Claims, 2 Drawing Sheets

(56) References Cited

U.S. PATENT DOCUMENTS

2019/0283129 A1 9/2019 Endoh et al.
2019/0355690 A1 11/2019 Nakako et al.

FOREIGN PATENT DOCUMENTS

| EP | 3 150 301 A1 | 4/2017 |
| EP | 3 569 329 A1 | 11/2019 |
| WO | WO 2019/065221 A1 | 4/2019 |

OTHER PUBLICATIONS

French Preliminary Search Report dated Mar. 3, 2021 in French Application 2008957 filed on Sep. 3, 2020, 3 pages (with English Translation of Categories of Cited Documents).

Conyers Herring, "Effect of Change of Scale on Sintering Phenomena" Journal of Applied Physics, vol. 21, Apr. 1950, pp. 301-303 and cover page.

Zhen-Wen Lin, et al. "Seed-Mediated Growth of Silver Nanocubes in Aqueous Solution with Tunable Size and Their Conversion to Au Nanocages with Efficient Photothermal Property" Chemistry a European Journal, vol. 22, 2016, pp. 2326-2332.

Qiang Zhang, et al., "Production of Ag Nanocubes on a Scale of 0.1 g per Batch by Protecting the NaHS-Mediated Polyol Synthesis with Argon" ACS Appl. Mater. Interfaces, Sep. 30, 2009, vol. 1, No. 9, pp. 1-13.

* cited by examiner

[Fig 1]
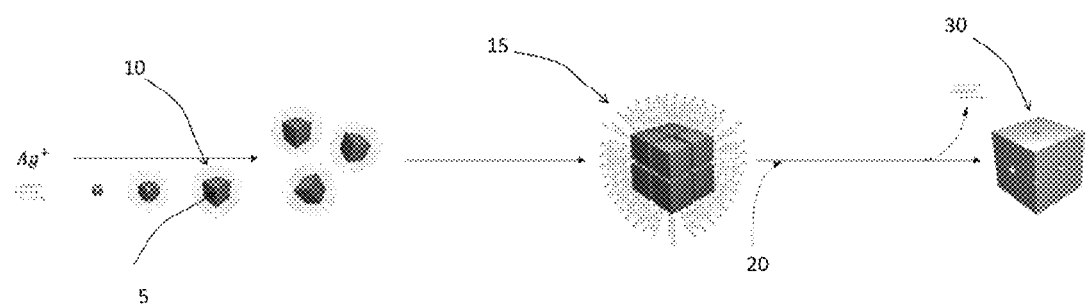
[Fig 2]
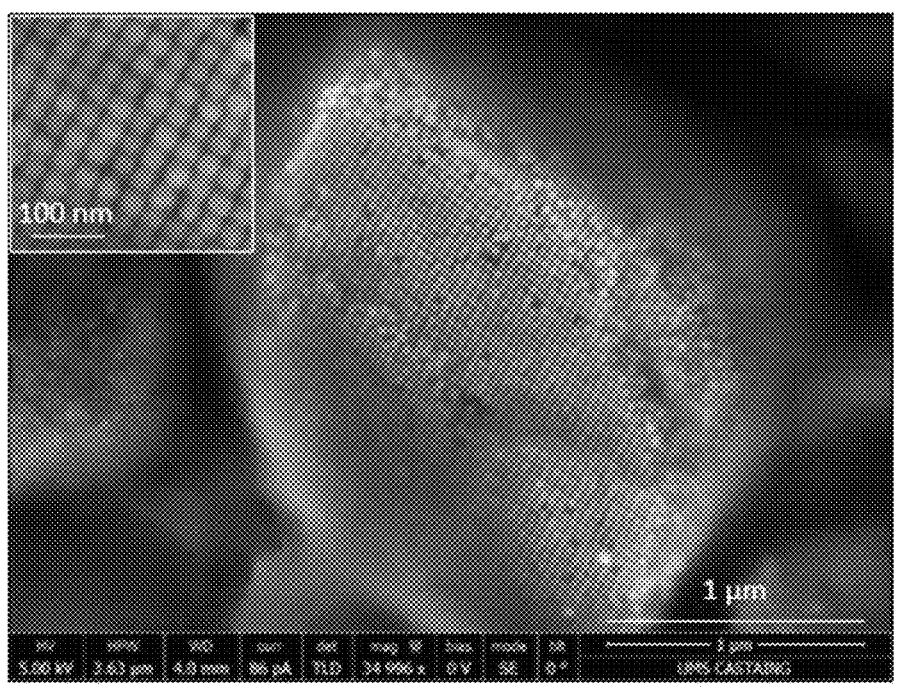

[Fig 3]
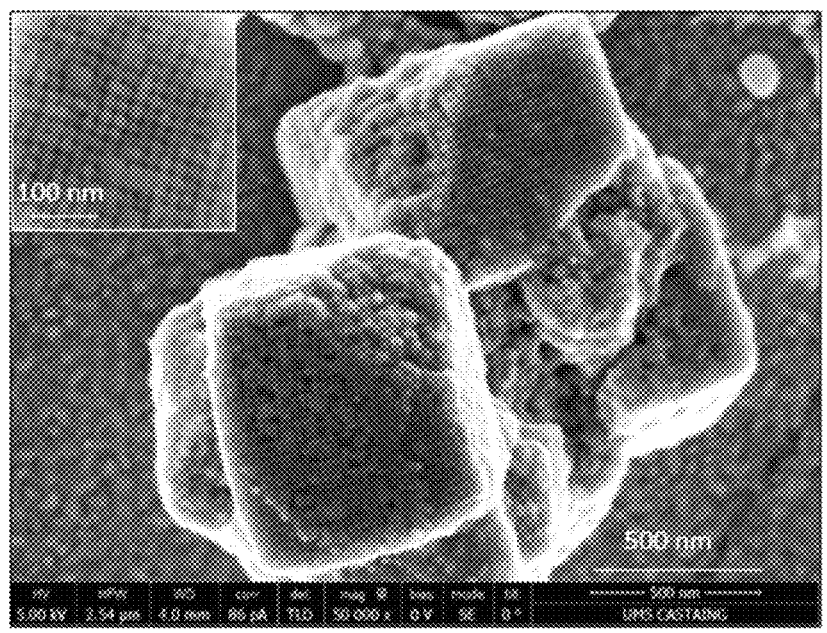

METHOD FOR INTERCONNECTING COMPONENTS OF AN ELECTRONIC SYSTEM BY SINTERING

TECHNICAL FIELD

The invention relates to a method for interconnecting components of an electronic system. In particular, it relates to the interconnection of an electronic chip, for example produced from a semiconductor material with a dielectric substrate or with another high performance electronic component.

PRIOR ART

Interconnecting the components of an electronic system is generally carried out by means of a dense metallic layer sandwiched between the components and in contact with them.

It has been known for a long time that an interconnection layer of this type can be produced by soldering, i.e. by fusion of a metal or an alloy, generally based on lead or tin that forms the interconnection layer after cooling. However, soldering alloys based on lead are generally harmful, while solders based on tin do not perform as well as lead-based solders.

Sintering a sintering paste based on silver is also a known technique for interconnecting electronic components. A sintered silver-based interconnection layer generally has better thermal properties and electrical properties than a tin solder. As an example, a sintered silver interconnection layer may have an electrical conductivity of more than $20 \times 10^6$ S·m$^{-1}$ and a thermal conductivity of the order of 200 W·m$^{-1}$·K$^{-1}$, while a soldered interconnection layer based on a Sn—Ag—Cu alloy has an electrical conductivity of $7.5 \times 10^6$ S·m$^{-1}$ and a thermal conductivity of the order of 50 W·m$^{-1}$·K$^{-1}$.

A sintering paste of this type generally comprises 90% by weight of particles of silver, a viscous solvent to limit spreading of the paste as it is being deposited and which is non-aqueous in order to limit oxidation of the silver during storage of the paste. It may also comprise additives for increasing the viscosity of the paste, as well as a stabilizing agent to prevent agglomeration of the particles. The stabilizing agent may also participate in improving the cohesion of the interconnection layer.

EP 3 150 301 A1 and US 2019/0283129 A1 each describe a bonding material and a bonding method implementing it. US 2015/0282330 A1 describes a conductive adhesive for serigraphy. EP 3 569 329 A1 describes a copper paste for pressureless bonding.

However, sintering necessitates heating to a temperature in the range 200° C. to 300° C., which proves to have deleterious effects on some electronic components which are sensitive to temperature. The sintering processes which are currently known are in particular not adapted to the interconnection of a component with a polymer substrate, a component produced from a doped semiconductor material, in which the charge carriers diffuse under the effect of temperature, or a component with a high thermal inertia, for example a radiator.

In order to reduce the sintering temperature, it is known to apply a pressure to the assembly of components to be sintered. However, applying a pressure could damage the components.

Another known means for reducing the sintering temperature is to formulate a sintering paste comprising micrometric particles and nanometric particles which are less than 100 nm in size. Nanometric particles of this type are more reactive than microparticles. They sinter between themselves at temperatures well below the fusion temperature of solid silver (961° C.). It is also well known that the time period required for sintering reduces in a non-linear manner along with a reduction in the particle size, for example in accordance with Herring's law of similarities, as described in the article by C. Herring, Journal of Applied Physics 21, 301 (1960).

It is also known, for example from WO 2019/065221 A1, to adjust the shape of nanoparticles into the form of platelets with a triangular or hexagonal base in order to increase the contact surface area of the interconnection layer with the components to be interconnected. A pressure may be applied to the components in order to favor a planar arrangement of the particles and bring the particles close to each other.

Furthermore, an interconnection layer which is as dense as possible is desired in order to obtain a mechanically strong interconnection with good electrical and thermal properties.

The application CN 108847395 A describes a sintering paste comprising nanoparticles of silver in the shape of platelets in order to favor a planar arrangement of the platelets as the sintering paste is being deposited. However, that paste necessitates that a pressure comprised between 1 MPa and 5 MPa be applied at a temperature of more than 230° C.; this is likely to damage certain electronic components.

The application CN 103606394 describes a sintering paste based on silver comprising spherical or platelet nanoparticles coated with a thixotropic agent in order to improve the rheological properties of the sintering paste and lead to a compact and disordered organization of the particles.

Thus, there is a need for a sintering method that is adapted to the interconnection of components of an electronic system which overcomes the disadvantages of the prior art.

DISCLOSURE OF THE INVENTION

The invention concerns a method for interconnecting components of an electronic system, the method comprising the steps of:
  a) depositing a sintering solution onto a first component in order to form an interconnection layer, the sintering solution comprising a solvent, metal nanoparticles dispersed in the solvent, and a stabilizing agent adsorbed onto the metal nanoparticles,
  the metal nanoparticles comprising for more than 95.0% of their mass a metal selected from silver, gold, copper and alloys thereof and having a polyhedral shape with an aspect ratio of more than 0.8.
  b) at least partially eliminating the solvent from the interconnection layer such as to form at least one ordered agglomerate in which the metal nanoparticles are regularly disposed in three axes, the stabilizing agent binding them together and maintaining at least a portion of the metal nanoparticles at a distance from each other,
  c) debinding and sintering the interconnection layer, and
  d) depositing a second component in contact with the interconnection layer before or during debinding or sintering.

The ordered arrangement of the metal nanoparticles increases the compactness of the agglomerate. The density of the nanoparticles per unit volume is increased, which improves the feasibility of contact between the nanoparticles during sintering. A particularly dense sintered interconnection layer is therefore obtained.

Preferably, the sintered interconnection layer has a density that is greater than or equal to 90%, preferably greater than or equal to 95% of the density of said metal. The density of the interconnection layer is measured by metallographic analysis after slicing and polishing the sintered interconnection layer, for example by electron microscopy.

Sintering Solution

The particles may comprise for more than 99.0%, or even more than 99.9% of their mass a metal selected from silver, gold, copper and alloys thereof.

Preferably, more than 95.0%, or even more than 99.0%, or even more than 99.9% of the mass of the metal nanoparticles is constituted by silver. Silver is preferred because it has an electrical conductivity and a thermal conductivity which are higher than those of gold and copper, it costs less than gold and it has a resistance to oxidation which is greater than that of copper.

The metal nanoparticles have a polyhedral shape. Advantageously, the polyhedral nanoparticles have small radii of curvature at the edges between their faces. The edges and the vertices of a polyhedral nanoparticle are particularly reactive zones that may be less covered by the stabilizing agent than the faces. Coalescence of metal nanoparticles coming into contact with each other at a temperature of less than 200° C. is therefore facilitated. A phenomenon of this type is known as "melting point depression".

The polyhedral shape is preferably convex. It may be regular. It may be selected from:
  a hexahedron, preferably a cube,
  an octahedron, and
  a cuboctahedron.

The polyhedral shape may be truncated, i.e. obtained by truncation of a regular polyhedron. Truncation of a truncated polyhedron consists of removing pyramidal portions at each vertex of the polyhedron, the pyramidal portions having a maximum of only one vertex in common.

Preferably, the metal nanoparticles are cubic in shape, optionally truncated.

The metal nanoparticles form a particulate assembly.

A first fraction of the particulate assembly may be formed by metal nanoparticles having a first polyhedral shape, and a second fraction of the particulate assembly may be formed by metal nanoparticles having a second polyhedral shape which differs from the first polyhedral shape. The second fraction may be the complement of the first fraction in the particulate assembly.

Furthermore, the metal nanoparticles have an aspect ratio of more than 0.8, preferably more than 0.9, or even more than 0.95, or even more than 0.99, for example equal to 1.

The "aspect ratio" of a particle is equal to the ratio of the smallest axis to the largest axis of the smallest circumscribing ellipsoid of the particle. As an example, a particle with a cubic shape which is circumscribed by a sphere has an aspect ratio equal to 1. The "aspect ratio" can be measured from an image acquired by scanning electron microscopy.

The size of the largest nanoparticle or nanoparticles of the particulate assembly is preferably less than 500 nm.

The "size" of a particle is the radius of the smallest circumscribing sphere of the particle. It can be measured from an image acquired by scanning electron microscopy or by dynamic light scattering.

The metal nanoparticles preferably have a mean size of less than 100 nm, preferably less than 50 nm.

They may have a mean size in the range 1 nm to 30 nm, and in particular at least 5 nm.

The "mean" size of a particulate assembly is the arithmetic mean of the sizes of the particles of the particulate assembly.

The particulate assembly may be polydisperse or, as is preferable, monodisperse in size. In the context of the invention, a particulate assembly which is monodisperse in size is such that the dispersion index as regards size, defined as the ratio of the difference between the ninetieth percentile $D_{90}$ and the tenth percentile $D_{10}$ of the size of the particles over the median size $D_{50}$ of the particles, is less than 0.2, preferably less than 0.1. In particular, a monodisperse particulate assembly may be such that the particles of which it is composed have the same size.

Preferably, the metal nanoparticles are cubic and the granular assembly which it forms is monodisperse in size. The formation of an agglomerate in which the cubic nanoparticles are aligned in three orthogonal axes is facilitated.

The stabilizing agent is adsorbed onto the metal nanoparticles. It keeps the metal nanoparticles apart and prevents them from agglomerating within the solution. It favors a homogeneous dispersion of the metal nanoparticles in the volume of the solution. Furthermore, it is customized so that during elimination of the solvent, the nanoparticles assemble in an ordered manner within the agglomerate.

The stabilizing agent may be selected from the group formed by anionic surfactants, amphoteric surfactants, cationic surfactants, non-ionic surfactants and mixtures thereof.

Preferably, the stabilizing agent is selected from surfactants comprising a hydrophilic head extended by a hydrophobic aliphatic chain. Surfactants of this type may be adsorbed onto the surface of metal nanoparticles in the form of a micellar bilayer by interdigitation of the aliphatic chains. The micellar bilayer favors the organization of the nanoparticles within the agglomerate. They may have an aliphatic chain containing fewer than 16 carbon atoms.

Preferably, the stabilizing agent is selected from cetyltrimethylammonium chloride, dodecyltrimethylammonium chloride, decyltrimethylammonium chloride, trimethylammonium chloride and mixtures thereof.

Preferably, the stabilizing agent is cetyltrimethylammonium chloride, known by the acronym CTAC.

The stabilizing agent may be functionalized in order to increase its reactivity with the destabilizing agent and facilitate sintering of the interconnection layer, for example by interposing a specific chemical group into the aliphatic chain, preferably an ester, ether or disulfide group, preferably an ester group, in order to introduce a cleavable chemical function into the aliphatic chain.

The solvent is preferably polar.

The solvent may be selected from water, ethanol, 1,2-propanediol, ethylene glycol, diethylene glycol and mixtures thereof.

Preferably, the solvent is aqueous, preferably water.

The sintering solution may be deposited using any known means, for example by screen printing, with a syringe, or by printing, in particular using an inkjet.

The volume of sintering solution deposited on the first component may be less than 100 μL, or even less than 10 μL, for example approximately 1 μL.

The interconnection layer deposited in step a) preferably extends over a surface area of less than 10 mm².

The sintering solution may comprise, as percentages by weight expressed on the basis of the mass of the sintering solution:
  between 5.0% and 50.0% of metal nanoparticles,
  between 0.1% and 4.0% of stabilizing agent, and
  between 46.0% and 94.9% of solvent.

The metal nanoparticles, the stabilizing agent and the solvent may represent more than 95.0%, preferably more than 99.0%, or even 100% of the mass of the sintering solution.

The sintering solution may furthermore comprise a texturing agent to increase the viscosity of the solution.

The sintering solution may comprise another particulate assembly formed by metal microparticles, the smallest of the microparticles being more than 1 μm in size. The metal microparticles are preferably formed from the same metal or alloy as the metal nanoparticles.

The shape of the metal microparticles may differ from that of the metal nanoparticles. In particular, the metal microparticles may have a platelet shape. The term "platelet shape" should be understood to mean a polyhedral shape for which the aspect ratio is less than 0.7, or even less than 0.5, or even less than 0.3. The metal microparticles increase the viscosity of the sintering solution in order to facilitate its deposition, for example by screen printing or with a syringe.

Thus, because of their size, the microparticles may be used to increase the volume of the interconnection layer without degrading the thermal, mechanical and electrical properties thereby.

The sintering solution may comprise, as percentages by weight expressed on the basis of the mass of the sintering solution:
  between 0.1% and 4.0% of stabilizing agent,
  between 46.0% and 94.9% of solvent,
  between 5.0% and 50.0% of metal nanoparticles and of metal microparticles,
  the ratio of the metal microparticles content to the sum of the metal nanoparticles content and metal microparticles content being in the range 0.3 to 0.7.

The metal nanoparticles, the metal microparticles, the stabilizing agent and the solvent may represent more than 95.0%, preferably more than 99.0%, or even 100% of the mass of the sintering solution.

Partial Elimination of Solvent

In step b), the solvent is at least partially eliminated from the interconnection layer.

Preferably, elimination of the solvent is carried out at a temperature of less than 200° C.

Elimination of the solvent preferably comprises evaporation and/or decomposition, preferably thermal, in particular dehydration, of the solvent.

The first component coated with the sintering solution may be disposed in a vessel for carrying out evaporation of the solvent. As an example, it is placed under a bell jar. The temperature to which the solvent is heated for evaporation and/or the partial pressure of the solvent inside the evaporation vessel may be controlled in order to accelerate or slow down the evaporation kinetics of the solvent. As an example, the partial pressure of the solvent may be controlled by placing a receptacle containing solvent in the vessel and/or by sucking out or trapping the evaporated solvent.

The solvent may be evaporated at a temperature of less than 50° C., for example comprised between 10° C. and 30° C., and/or for a period comprised between 0.5 h and 10 h, preferably between 2 h and 5 h.

The solvent residues may be decomposed thermally, optionally after evaporation. The solvent is then heated to a temperature which is greater than or equal to its thermal decomposition temperature. Preferably, the thermal decomposition of the solvent is carried out at a temperature of less than 200° C., and in particular of at least 100° C. Thermal decomposition of the solvent may be carried out for a period comprised between 0.5 h and 10 h.

The solvent may be heated by heating the first component, the heat flux applied to the first component being transmitted to the interconnection layer. As an example, a lower face of the first component which is opposite to the face on which the interconnection layer is placed may be heated.

The evaporation and/or thermal decomposition may be carried out under a neutral atmosphere, for example under argon, or under a reducing atmosphere, in order to prevent oxidation of the metal nanoparticles.

A portion or, as is preferable, all of the solvent contained in the interconnection layer may be eliminated.

More than 95%, or even more than 99%, or even 100% of the quantity of solvent contained in the interconnection layer may be evaporated.

During the elimination of the solvent, the concentration of metal nanoparticles and of stabilizing agent may increase within the sintering solution. It may result in an agglomeration of the metal nanoparticles between themselves. The stabilizing agent adsorbed onto the nanoparticles then acts as a binder between the nanoparticles. Furthermore, it maintains the nanoparticles apart from each other within the agglomerate which is formed thereby. Finally, it favors their arrangement in a manner such that the agglomerate is ordered in three axes, which are preferably orthogonal with respect to each other.

The metal nanoparticles may form one or more agglomerates.

The stabilizing agent may form a layer interposed between the metal nanoparticles and in contact with the metal nanoparticles, with a thickness which is comprised between 1 nm and 10 nm, for example.

The agglomerate is "ordered", i.e. it has an arrangement of nanoparticles which is regular, preferably periodic, in three axes which are different with respect to each other and are preferably orthogonal with respect to each other. The ordered agglomerate preferably has a crystalline arrangement in the three axes and is termed a "super-crystal". Preferably, the agglomerate is defined by regular repetition, preferably periodic, of an elementary pattern comprising metal nanoparticles in the three axes. In particular, the elementary pattern can be repeated more than five times, even more than ten times, even more than fifty times along each axe. The elementary pattern may be a simple cubic, centered cubic, face centered cubic, preferably simple cubic. A simple cubic elementary pattern is defined by a cube, the metal nanoparticles of which it is composed being disposed equidistantly from each other at the vertices of the cube.

For instance, an ordered agglomerate is easily differentiated from a non-ordered agglomerate by scanning electron microscopy.

Preferably, the particulate assembly is monodisperse in size and formed by cubic metal nanoparticles, the nanoparticles defining a simple cubic lattice which is periodically repeated in three orthogonal axes.

Preferably, an agglomerate of this type is formed by a particulate assembly, which is monodisperse in size, of nanoparticles of silver with a size which is comprised between 10 nm and 100 nm, the CTAC being disposed between the facing faces of the nanoparticles of silver.

Preferably, the facing faces of the adjacent nanoparticles are spaced apart by a distance comprised between 1 nm and 10 nm, for example comprised between 2 nm and 4 nm.

In particular, the agglomerate may have a parallelepipedal shape, for example cubic, which is possibly truncated at the edges and vertices of the "super-crystal". The length of the agglomerate may be in the range 500 nm to 3000 nm.

Debinding and Sintering

Step c) comprises debinding and sintering the interconnection layer.

Preferably, debinding is carried out by bringing the agglomerate into contact with at least one destabilizing agent which is configured to desorb the stabilizing agent from the metal nanoparticles in order to aggregate and coalesce said metal nanoparticles between themselves.

The destabilizing agent interacts with the stabilizing agent in order to desorb the stabilizing agent from the surface of the metal nanoparticles. The destabilizing agent can therefore be used to extract or eliminate at least a portion of the stabilizing agent from the agglomerate. The stabilizing agent is then no longer interposed between the metal nanoparticles. The metal nanoparticles therefore tend to come into contact under the effect of attractive forces and form an aggregate. Furthermore, because of their small size and their polyhedral shape, they have a high surface reactivity, in particular at the polyhedral edges and vertices, which initiates their coalescence and sintering of the aggregate. The interconnection layer may then readily be sintered at a temperature of 200° C. or less, and in particular at a temperature of 100° C. or more. It may furthermore be sintered without the need to apply pressure. Components of an electronic system that are damaged under the effect of too high a temperature or too high a pressure may therefore easily be interconnected by carrying out the method in accordance with the invention.

With knowledge of the stabilizing agent, the person skilled in the art will readily and in a routine manner be able to select such a destabilizing agent.

In particular, the destabilizing agent may be selected from an alcohol, in particular methanol, ethanol or isopropanol, sodium styrene sulfonate, sodium polystyrene sulfonate, trifluoroacetic acid and mixtures thereof.

In a variational embodiment in which the stabilizing agent is selected from cetyltrimethylammonium chloride, dodecyltrimethylammonium chloride, decyltrimethylammonium chloride, trimethylammonium chloride and mixtures thereof, the destabilizing agent is preferably selected from methanol, ethanol, sodium styrene sulfonate, sodium polystyrene sulfonate, trifluoroacetic acid and mixtures thereof, preferably sodium polystyrene sulfonate.

The destabilizing agent may, for example, be deposited onto the interconnection layer in the form of a droplet.

Debinding may be carried out by thermally decomposing the stabilizing agent.

The step for debinding and sintering is preferably carried out at a temperature of less than 200° C., or even less than or equal to 150° C., and preferably greater than or equal to 100° C.

It may be carried out at a temperature greater than or equal to 100° C., for example at a temperature comprised between 100° C. and 150° C. A step of this type may therefore be carried out when at least one of the first and second components is particularly sensitive to temperature. Furthermore, this embodiment is preferred when debinding is carried out by bringing the agglomerate into contact with the destabilizing agent.

In accordance with a variation, the step for debinding and sintering may be carried out at a temperature of more than 100° C., and for example comprised between 120° C. and 190° C. in order to densify and reduce the porosity of the interconnection layer and to increase the mechanical strength of the assembly formed by the first and second components and by the interconnection layer. This embodiment is preferred when debinding is carried out by evaporation and thermal decomposition of the solvent.

The step for debinding and sintering may be carried out for a period comprised between 0.5 h and 10 h.

Furthermore, the temperature at which debinding is carried out may be lower than the temperature at which sintering is carried out. Debinding may be carried out at temperatures that are respectively lower than and higher than the evaporation temperature of the destabilizing agent. Debinding may be carried out at a temperature of less than 100° C. Thus, during sintering, the residual destabilizing agent which has not reacted with the stabilizing agent may be evaporated in a manner such as to reduce the presence of residual organic elements in the sintered interconnection layer.

The interconnection layer may be maintained at and in particular heated to the same temperature during step b) for the elimination of solvent and step c) for debinding and sintering.

In step c) and step d), sintering may be carried out without the application of any pressure, i.e. other than the weight of the second component. The term "pressure" means any force per unit surface area applied to the interconnection layer other than the weight of the first component or of the second component.

Sintering may be carried out without the application of any pressure to the interconnection layer.

In a variation, a pressure may be applied to the interconnection layer which is preferably less than 0.1 MPa.

Deposition of Second Component

The second component is deposited onto the interconnection layer before, during or after the debinding step. Thus, at the end of sintering, the interconnection layer adheres to the second component and hence connects the first and second components.

The thickness of the sintered interconnection layer may be comprised between 500 nm and 50 μm.

The residual organic species content represents less than 5% of the mass of the sintered interconnection layer.

The shear stress at rupture of the assembly formed by the sintered interconnection layer and the first and second components is preferably more than 10 MPa.

The electrical conductivity of the sintered interconnection layer is preferably more than $5\times10^6$ S·m$^{-1}$. The thermal conductivity of the interconnection layer is preferably more than $30\times10^6$ W·m$^{-1}$·K$^{-1}$. The coefficient of thermal expansion is preferably less than $30\times10^{-6}$ K$^{-1}$.

The first component and/or the second component of the electronic system may be selected from a support, which in particular is flexible and/or for printing a printed circuit, a chip produced from a semiconductor material, in particular a flip chip, a light emitting diode, in particular less than 5 mm in size, preferably less than 2 mm, a component of an electronic power system.

At least one of the first and second components may be less than 1 mm in length and/or less than 500 μm in thickness. The method in accordance with the invention can be used for low temperature sintering and is highly suitable for the interconnection of small sized components which are easy to damage under the effect of too high a temperature. In particular, the invention is highly suitable for step-by-step component interconnection.

The support may comprise a dielectric substrate produced from a polymeric material for which the fusion temperature is less than 300° C.

In particular, in accordance with one embodiment, the first component is a printing support for a printed circuit and the second component is a semiconductor material.

The printing support for a printed circuit may comprise a dielectric substrate at least partially coated with a layer of metal, in particular produced from a metal selected from silver, gold, copper and alloys thereof, preferably silver or gold. The sintering solution may be deposited on the layer of metal.

The layer of metal may be functionalized in order to reduce the surface wettability, to minimize spreading of the sintering solution over the support and to facilitate agglomeration of the nanoparticles during step b).

It may be functionalized by means of a substance selected from an aliphatic thiol, a perfluorinated thiol and mixtures thereof. Preferably, it is functionalized by means of an aliphatic thiol. After functionalization, the wetting angle of the sintering solution on the substrate is preferably more than 100°, preferably more than 120°.

The layer of metal may be cleaned prior to functionalization and to deposition of the sintering solution in order to remove organic pollutants that are naturally present on the surface of the layer of gold.

In accordance with another exemplary embodiment, at least one of the first and second components is a thermal radiator for an electronic power system. A radiator of this type is therefore easier to interconnect with the method in accordance with the invention, which may be carried out at a temperature of less than 200° C., than with methods of the prior art.

In fact, it is difficult to heat the radiator to a temperature of more than 200° C. with known sintering methods, because the temperature ramp-up time is long due to the thermal inertia of the radiator. For this reason, with prior art methods, the radiators are generally interconnected on a support after interconnecting semiconductor chips the thermal and mechanical properties of which are frequently degraded at a lower temperature than the radiators.

Thus, the invention furthermore concerns the interconnection of a radiator for an electronic system with a first component of the electronic system by means of the method in accordance with the invention, followed by interconnection of an electronic chip with a second component of the electronic system by means of the method in accordance with the invention. The first and second components may be identical, for example a printing support for a printed circuit.

Other Optional Steps

Prior to step a), the method may comprise the preparation of the sintering solution.

The preparation of the sintering solution may comprise dissolving a salt comprising the metal forming the metal nanoparticles and the stabilizing agent in a solvent, followed by germination and growth of the nanoparticles.

The preparation of the sintering solution may furthermore comprise cleaning the metal nanoparticles and dispersion of the nanoparticles in the solvent.

Furthermore, the invention concerns a sintering solution comprising a solvent, metal nanoparticles dispersed in the solvent, and a stabilizing agent adsorbed onto the nanoparticles, more than 95.0% of the mass of the metal nanoparticles comprising a metal selected from silver, gold, copper and alloys thereof and having a polyhedral shape with an aspect ratio of more than 0.8, the sintering solution comprising, as percentages by weight:
between 5.0% and 50.0% of metal nanoparticles,
between 0.1% and 4.0% of stabilizing agent, and
between 46.0% and 94.9% of solvent.

The sintering solution may in particular comprise one or more of the optional features described above.

The invention will now be illustrated by means of the examples below and the accompanying drawings, in which FIG. 1 schematically represents an exemplary embodiment of the method in accordance with the invention, FIG. 2 is a photograph acquired by electron microscopy of an agglomerate of nanoparticles of silver obtained from an exemplary embodiment of the method, and FIG. 3 is a photograph acquired by electron microscopy of an agglomerate of nanoparticles of silver obtained from another exemplary embodiment of the method.

EXAMPLE 1

FIG. 1 schematically illustrates an exemplary embodiment of the method in accordance with the invention.

Prior to step a), a base solution comprising cubic silver nanoparticles 5 with a size of less than 30 nm dispersed in 18.2 MΩ demineralized water and stabilized with CTAC, 10, was prepared using the method described in Chem. Eur. J. 2016, 22, 2326-2332, doi: 10.1002/chem.201504303, which was modified as follows. A germination solution containing silver seeds was initially prepared in a 50 mL flask, with stirring. 10 mL of a 0.5 mM aqueous solution of CTAC and 25 µL of an aqueous 0.1 M silver nitrate solution were introduced into the flask in order to form a reaction medium. After homogenizing for 10 minutes, 0.45 mL of an aqueous 0.08 M sodium borohydride solution was added to the reaction medium. The germination solution obtained thereby was maintained at 30° C., with stirring, for 1 h. Two distinct volumes of the germination solution were then used to grow cubic silver nanoparticles with sizes equal to 32 nm and 21 nm respectively. A first volume of 43 mL and a second volume of 39.5 mL respectively of 18.2 MΩ demineralized water were introduced into two distinct 100 mL flasks at a temperature of 60° C. 200 mg of CTAC was introduced into each of the flasks. Volumes of 1.5 mL and 5 mL of the germination solution were respectively added to the flasks. 500 µL of a 0.1 M aqueous silver trifluoroacetate solution was then added to each flask. After homogenizing for 20 minutes, 5 mL of 0.1 M aqueous ascorbic acid solution was introduced and added to each flask. The growth solutions obtained in this manner were maintained at 60° C., with stirring, for 1.5 h. The cubic nanoparticles synthesized in this manner were washed several times with 18.2 MΩ demineralized water by centrifuging and redispersed in a reduced volume of 18.2 MΩ demineralized water. The base solution was then concentrated by solvent evaporation, by vacuum evaporation or in a stream of argon in order to constitute a sintering solution comprising the desired percentage by weight of aqueous solvent.

The base solution was washed with 18.2 MΩ demineralized water by centrifuging in order to eliminate the excess CTAC.

The nanoparticles were then dispersed in a small volume of 18.2 MΩ demineralized water. A sintering solution comprising, as percentages by weight, 5% of cubic silver nanoparticles, 0.4% of CTAC and 94.6% of water was then obtained, as illustrated in FIG. 1.

A droplet of sintering solution with a volume of 15 µL was then deposited onto a dielectric substrate coated with a 30 nm thick layer of gold. The layer of gold had been functionalized using hexadecanethiol, which is an aliphatic thiol, in order to minimize the wettability of the substrate and spreading of the sintering solution.

The substrate had already been cleaned with a plasma in order to eliminate organic pollutants on the surface of the substrate.

The sintering solution was then evaporated for 2 hours at a temperature of 30° C. under a bell jar. Another test was carried out by evaporating the solution over 3 hours at a temperature of 20° C. The rate of evaporation was controlled by the temperature prevailing in the bell jar.

Ordered agglomerates 15 were then produced; the silver nanoparticles organized themselves into the form of a supercrystal with a simple cubic structure, as can be observed in FIGS. 2 and 3. The agglomerates forming in the water were then deposited onto the substrate by sedimentation. The agglomerates had a generally cubic shape and a size comprised between 500 nm and 3000 nm.

FIGS. 2 and 3 are photographs acquired by scanning microscopy of ordered agglomerates formed at 22° C. from cubic silver nanoparticles with a size equal to 31 nm and 21 nm respectively. The adjacent nanoparticles are spaced apart by approximately 3±1 nm.

Thus, the agglomerates form a 3D film which covers the substrate. They comprise approximately 8.0% by weight CTAC and have a density comprised between 70% and 80% of the density of silver. The CTAC content was measured by thermogravimetric analysis.

Debinding of the agglomerates of Example 1 was carried out by depositing a droplet of ethanol with a volume of 5 μL onto the interconnection layer as a destabilizing agent 20, at a temperature of 25° C.

After a period of 2 hours so that the ethanol had sufficiently desorbed the CTAC from the surface of the nanoparticles, a conventional heat treatment under argon was carried out as follows: a temperature ramp-up of 45 min, a constant temperature stage maintaining the temperature at 185° C. for 2 h, followed by cooling for a period of 1 h in order to sinter the interconnection layer by aggregation and coalescence of nanoparticles of silver in the form of sintered aggregates 30.

An interconnection layer was thus obtained that had a density of more than 90% of the density of silver.

Clearly, the invention is not limited to the exemplary embodiments of the method presented above by way of illustration.

The invention claimed is:

1. A method for interconnecting components of an electronic system, the method comprising the steps of:
   a) depositing a sintering solution onto a first component in order to form an interconnection layer, the sintering solution comprising a solvent, metal nanoparticles dispersed in the solvent, and a stabilizing agent adsorbed onto the metal nanoparticles,
   the metal nanoparticles comprising for more than 95.0% of their mass a metal selected from silver, gold, copper and alloys thereof and having a polyhedral shape with an aspect ratio of more than 0.8,
   the stabilizing agent is one or more surfactants customized so that during elimination of the solvent, the metal nanoparticles assemble in a least one ordered agglomerate,
   b) eliminating, at least partially, the solvent from the interconnection layer such as to form at least one ordered agglomerate in which the metal nanoparticles are regularly disposed in three axes, the stabilizing agent binding them together and maintaining at least a portion of the metal nanoparticles at a distance from each other,
   c) debinding and sintering the interconnection layer, and
   d) depositing a second component in contact with the interconnection layer before or during debinding or sintering.

2. The method according to claim 1, the metal nanoparticles comprising for more than 99.0% of their mass a metal selected from silver, gold, copper and alloys thereof.

3. The method according to claim 1, the sintered interconnection layer having a density that is greater than or equal to 90% of the density of said metal.

4. The method according to claim 1, more than 95.0% of the mass of the metal nanoparticles being constituted by silver.

5. The method according to claim 1, the metal nanoparticles being cubic in shape.

6. The method according to claim 1, the metal nanoparticles forming a granular assembly which is monodisperse in size.

7. The method according to claim 1, the sintering solution comprising, as percentages by weight expressed on the basis of the mass of the sintering solution:
   between 5.0% and 50.0% of metal nanoparticles,
   between 0.1% and 4.0% of stabilizing agent, and
   between 46.0% and 94.9% of solvent.

8. The method according to claim 1, the solvent being selected from water, ethanol, 1,2-propanediol, ethylene glycol, diethylene glycol and mixtures thereof.

9. The method according to claim 1, the stabilizing agent being selected from cetyltrimethylammonium chloride, dodecyltrimethylammonium chloride, decyltrimethylammonium chloride, trimethylammonium chloride and mixtures thereof.

10. The method according to claim 9, the stabilizing agent being cetyltrimethylammonium chloride.

11. The method according to claim 1, the elimination of solvent in step b) comprising evaporation and/or decomposition of the solvent.

12. The method according to claim 1, step b) for eliminating the solvent being carried out at a temperature of less than 200° C.

13. The method according to claim 1, debinding and sintering in step c) being carried out by bringing the at least one ordered agglomerate into contact with at least one destabilizing agent configured to desorb the stabilizing agent from the metal nanoparticles in order to aggregate and coalesce said metal nanoparticles between themselves.

14. The method according to claim 13, the at least one destabilizing agent being selected from an alcohol, sodium styrene sulfonate, sodium polystyrene sulfonate and mixtures thereof.

15. The method according to claim 1, the at least one ordered agglomerate being defined by regular repetition of an elementary pattern comprising metal nanoparticles along three axes, the elementary pattern being simple cubic, centered cubic or face centered cubic.

16. The method according to claim 1, step c) for debinding and sintering being carried out at a temperature of less than 200° C.

17. The method according to claim 1, in which the first component and/or the second component of the electronic system are selected from a support, a chip produced from a semiconductor material, a light emitting diode, and a component of an electronic power system.

18. The method according to claim 1, the metal nanoparticles having a truncated cubic shape.

* * * * *